(12) United States Patent
Kiwitt et al.

(10) Patent No.: US 8,558,356 B2
(45) Date of Patent: Oct. 15, 2013

(54) ELECTRICAL COMPONENT

(75) Inventors: Juergen Kiwitt, Munich (DE); Maximilian Pitschi, Rottach-Egern (DE); Christian Bauer, Munich (DE); Robert Koch, Munich (DE)

(73) Assignee: EPCOS AG, Munich (DE)

( * ) Notice: Subject to any disclaimer, the term of this patent is extended or adjusted under 35 U.S.C. 154(b) by 1006 days.

(21) Appl. No.: 12/606,417

(22) Filed: Oct. 27, 2009

(65) Prior Publication Data

US 2010/0091473 A1 Apr. 15, 2010

Related U.S. Application Data

(63) Continuation of application No. PCT/EP2008/055255, filed on Apr. 29, 2008.

(30) Foreign Application Priority Data

Apr. 30, 2007 (DE) .......................... 10 2007 020 288

(51) Int. Cl.
*H01L 29/40* (2006.01)
*H01L 23/34* (2006.01)

(52) U.S. Cl.
USPC ........... 257/664; 257/724; 257/698; 257/778; 257/E23.011

(58) Field of Classification Search
USPC ................... 257/664, 724, 698, 778, E23.011
See application file for complete search history.

(56) References Cited

U.S. PATENT DOCUMENTS

| | | | |
|---|---|---|---|
| 5,438,305 A | 8/1995 | Hikita et al. | |
| 5,471,722 A | 12/1995 | Yatsuda | |
| 5,920,142 A | 7/1999 | Onishi et al. | |
| 6,218,729 B1 | 4/2001 | Zavrel, Jr. et al. | |
| 6,362,525 B1 | 3/2002 | Rahim | |
| 6,982,380 B2 | 1/2006 | Hoffmann et al. | |
| 7,102,462 B2 | 9/2006 | Taniguchi et al. | |
| 7,388,281 B2 * | 6/2008 | Krueger et al. | 257/678 |
| 2004/0058473 A1 * | 3/2004 | Feiertag et al. | 438/108 |
| 2005/0066419 A1 * | 3/2005 | Lee | 2/181 |
| 2005/0116790 A1 | 6/2005 | Hongo et al. | |
| 2005/0195047 A1 | 9/2005 | Park et al. | |
| 2005/0230812 A1 | 10/2005 | Przadka | |
| 2005/0242420 A1 | 11/2005 | Matsuda et al. | |

(Continued)

FOREIGN PATENT DOCUMENTS

| | | |
|---|---|---|
| DE | 102 28 328 A1 | 1/2004 |
| DE | 102 43 511 A1 | 4/2004 |

(Continued)

OTHER PUBLICATIONS

Zoschke, K., "Fabrication of Application Specific Integrated Passive Devices Using Wafer Level Packaging Technologies", IEEE Transactions on Advanced Packaging, Aug. 2007, 359-368, vol. 30, No. 3.

*Primary Examiner* — Nitin Parekh
(74) *Attorney, Agent, or Firm* — Slater & Matsil, L.L.P.

(57) ABSTRACT

A stable electrical component includes a carrier substrate and a chip (2) mounted thereon. The component has a reactance element and a supporting element, which are at least partly arranged between the carrier substrate and the chip. The reactance element is at least partly realized by means of at least one conductor track. The reactance element includes a coil, a capacitor or a transmission line.

34 Claims, 9 Drawing Sheets

(56) References Cited

U.S. PATENT DOCUMENTS

| | | |
|---|---|---|
| 2006/0066419 A1* | 3/2006 | Iwaki et al. .................. 333/133 |
| 2006/0151203 A1 | 7/2006 | Krueger et al. |
| 2006/0267178 A1 | 11/2006 | Metzger |
| 2007/0035364 A1 | 2/2007 | Sridhar et al. |
| 2007/0222056 A1 | 9/2007 | Bauer et al. |
| 2009/0071710 A1 | 3/2009 | Stelzl et al. |
| 2009/0127697 A1* | 5/2009 | Pahl ............................ 257/698 |

FOREIGN PATENT DOCUMENTS

| | | |
|---|---|---|
| DE | 10 2004 005 668 A1 | 8/2005 |
| DE | 10 2005 029 453 A1 | 12/2006 |
| DE | 10 2006 025 162 B3 | 1/2008 |
| EP | 0 684 647 A1 | 11/1995 |
| JP | 05-267403 A | 10/1993 |
| JP | 08-274575 A | 10/1996 |
| JP | 10-270975 A | 10/1998 |
| JP | 2003-087091 A | 3/2003 |
| JP | 2005-514846 A | 5/2005 |
| JP | 2005-198073 A | 7/2005 |
| JP | 2005-536879 A | 12/2005 |
| JP | 2006-060563 A | 3/2006 |
| JP | 2006-311183 A | 11/2006 |
| JP | 2009-505489 A | 2/2009 |
| WO | WO 00/54337 | 9/2000 |
| WO | WO 2005/102910 A1 | 9/2000 |

* cited by examiner

ELECTRICAL COMPONENT

This application is a continuation of co-pending International Application No. PCT/EP2008/055255, filed Apr. 29, 2008, which designated the United States and was not published in English, and which claims priority to German Application No. 10 2007 020 288.3 filed Apr. 30, 2007, both of which applications are incorporated herein by reference.

BACKGROUND

An electrical component comprising integrated passive elements is known, e.g., from U.S. Patent application publication no. 2006/0151203 A1.

SUMMARY

In one aspect, the invention specifies a stable electrical component which contains integrated passive elements with low ohmic losses.

An electrical component comprising a carrier substrate and at least one chip mounted thereon is specified. The component has a supporting element and a reactance element, which are at least partly arranged between the carrier substrate and the chip. In this case, the reactance element is partly realized by means of conductor tracks. The reactance element comprises at least one element selected from at least one coil, at least one capacitor and at least one transmission line. The transmission line is taken to mean a line which brings about a phase shift of at least 30 degrees at a pass frequency of the component. The reactance element can be electrically connected to the chip. Preferably, however, contact is made with the chip directly via the substrate rather than via the reactance element.

In one embodiment, the chip has component structures which operate with acoustic waves and which are arranged on that side of the chip which faces the carrier substrate. The component structures comprise at least one component selected from an acoustic resonator (e.g., SAW or BAW resonator), an electroacoustic transducer, and an acoustic reflector.

In one embodiment, the chip has an acoustic track, in which at least one transducer is arranged and in which a surface acoustic wave is able to propagate. The track is preferably delimited on both sides by reflectors in order to form a resonator operating with surface acoustic waves. In this case, the component structures are preferably arranged on a piezoelectric substrate.

The chip can also comprise an acoustic resonator operating with bulk acoustic waves. In this case, the resonator has layers arranged one above another, including at least one piezoelectric layer arranged between two electrode layers. The bulk wave is able to propagate in the vertical direction.

A plurality of acoustic resonators electrically connected to one another are preferably realized in the chip. The resonators together realize at least one radio-frequency filter.

In this way, it is possible to realize in the chip at least two filters which together form a frequency-separating network. In one embodiment, the first filter is provided as a transmission filter and the second filter is provided as a reception filter. The first filter preferably blocks in the passband of the second filter, and vice versa. The frequency-separating network comprising a transmission filter and a reception filter is usually referred to as a duplexer. The frequency-separating network comprising two filters assigned to different transmission bands is usually referred to as a diplexer.

The supporting element produces a mechanically supporting connection between chip and carrier substrate. During molding processes, in particular, the chip is subjected to high force loading. The supporting element results in the force being forwarded into the carrier substrate and reduces a disadvantageous deformation of the chip or prevents a fracture in the case of particularly high stress. The supporting element can be arranged directly between chip and substrate or else between chip and component structures arranged on the substrate. In the latter case, the supporting element transmits the force directly to the component structures and thus indirectly to the carrier substrate.

The supporting element can also have an electrical function alongside the mechanical function. For this purpose, it can be electrically conductive and be electrically connected to the reactance element and/or the carrier substrate. The supporting element can be connected to ground via electrical lines in the carrier substrate. The reactance element can also be connected to ground via the supporting element.

An electrical connecting function is not absolutely necessary, however. The supporting element can also support the chip without producing an electrical connection of the carrier substrate or reactance element and chip.

The reactance element is preferably electrically connected directly via the carrier substrate. As stated, a further electrical connection of the reactance element can be effected via the supporting element, preferably to ground. In one embodiment, the reactance element can also be electrically connected to the chip via the supporting element.

The electrical connection of the chip to the carrier substrate can be effected via bumps, for example, via solder or stud bumps. On account of the material properties, however, the bumps are not as well suited to the mechanical support of the chip as the supporting elements especially provided for this purpose. An additional factor is that the relative position of the bumps at the chip cannot be chosen arbitrarily, with the result that an optimized supporting function for the chip cannot be ensured solely by means of the bumps. In addition to the bumps, however, electrical connections between chip and carrier substrate can also be performed by means of one or a plurality of supporting elements, in particular, by means of pillars.

In one embodiment, the component comprises a matching network for the impedance matching of the respective filter or of the frequency-separating network. The matching network is preferably arranged between an antenna and the frequency-separating network and can ensure, for example, a high input impedance of the second filter in the passband of the first filter, and vice versa. High isolation between two signal paths which are connected to a common antenna connection and are to be separated from one another can thus be obtained. The matching network comprises at least one reactance element, e.g., at least one capacitor, at least one coil, at least one transmission line, a coupler and/or transformer. The transmission line is preferably provided as a phase shifter. The elements of the matching network and, in particular, the respective inductance value of the coil are chosen depending on the input impedance to be matched of the respective circuit realized on the chip. There is the possibility of trimming the matching network by altering the geometry of its elements. This is explained below on the basis of the example of the coil.

In one embodiment, the reactance element, in particular, the coil, is preferably arranged in a shunt branch. In one embodiment, the shunt branch is connected between the antenna connection and ground.

A coil in a shunt branch makes it possible to produce additional electromagnetic poles in the transfer function of the filter or of the frequency-separating network and thus to improve the selection or isolation.

The reactance element can also be arranged in a series branch. The series branch can be arranged in a transmission path, a reception path or a transmission/reception path. A series inductance also makes it possible to improve the electrical properties of the component. In one embodiment, the at least one coil can be embodied both as parallel inductance and as series inductance.

The reactance elements can in each case be arranged between the chip and the carrier substrate preferably on the top side of the carrier substrate and be realized by means of a conductor track or a conductive area.

A supporting element arranged on a reactance element can be composed, for example, of a local thickening or elevation of the element.

The chip is preferably spaced apart from the carrier substrate, that is to say that a gap is arranged in between. The chip is mounted on the carrier substrate preferably by means of flip-chip technology. The distance is determined by the height of the supporting element if appropriate in conjunction with further structures arranged thereabove or therebelow.

In one advantageous embodiment, as a supporting element, a peripheral closed frame is arranged between the chip and the carrier substrate, in the edge region of the chip, which frame can be electrically conductively connected to the reactance element. A closed cavity is formed between the frame, the chip and the carrier substrate. The component structures of the reactance elements or at least one conductor track provided for forming the coil are arranged in the cavity. The conductor track, unless specified in further detail, is referred to simply as a conductor track hereinafter.

The reactance element enclosed in the cavity, e.g., a coil, is thus protected against environmental influences and thus also against corrosion. Consequently, the inductance value set remains highly stable, reckoned over the lifetime of the component. The conductor track of the coil can be passivated by an organic or inorganic protective layer or a natural oxidation layer.

The coil preferably has at least one conductor track section embodied in the form of a spiral or a loop and having at least one three-quarter turn or having at least one complete turn. The spiral can have a fraction of turns, e.g., one and a half turns.

The distance between the windings can be chosen to be less than, equal to or greater than the width of the conductor track. Within a coil, the width of the conductor track, in the case of different windings of the spiral, can be chosen to be different under certain circumstances. The distance between the windings can also be chosen to be different. The spiral pitch and also the spiral thickness can therefore vary in each case from winding to winding. The transition between the regions having different widths can take place in stepwise or continuously variable fashion.

The ratio of the height of the conductor track to the width is preferably 1:2. In another embodiment, the ratio of the height of the conductor track to the width is 1:1. The height of the conductor track is preferably at least 25 micrometers. The supporting element then advantageously has a height of more than 25 micrometers in relation.

A relatively large height of the conductor track has advantages particularly in the case of a rough surface of the carrier substrate, which is applicable to ceramic substrates, for example. The rough surface of the carrier substrate leads to a rough interface with the conductor track or to a rough underside of the conductor track, which can be disadvantageous for the quality factor of the coil. As a result of a relatively high conductor track, an appreciable proportion of the current passing through the coil is transferred to the surface and side areas of the conductor track, that is to say away from the rough interface. A small conductor track width, relative to the conductor track height, is also advantageous. The proportion of the rough interface can be reduced, in particular, when the conductor track has regions floating, i.e., not supported or projected, above the carrier substrate.

In one embodiment, a floating region of the conductor track is supported only on one side in cross section (L profile or T profile). However, a floating region can also be supported in at least two regions spaced apart from one another and form a type of bridge. The bridge, apart from its supported regions, floats above the carrier substrate. If provision is made for providing such a bridge with an element supporting the chip, then the supported regions of the bridge (as it were the "bridge piers") can be used as suitable positions for arranging the supporting element on the conductor track.

A seed layer is preferably arranged on the top side of the carrier substrate. The seed layer preferably comprises an adhesion layer containing metallic Ti or a Ti alloy. The thickness of the adhesion layer is, e.g., up to 50 nm or more. The seed layer additionally preferably comprises at least one further layer produced on the adhesion layer. The partial layers of the seed layer are applied by sputtering, for example. The upper partial layer of the seed layer, which preferably has a thickness of at most 1 micrometer, can contain Cu or Ni. The seed layer can also be patterned.

Structures of the seed layer serve, e.g., as a support for producing a high-quality conductor track. The conductor track is arranged on the seed layer and has at least one conductive layer grown on the seed layer, preferably a metal layer. The metal layer is preferably produced in a deposition method, such as, e.g., in an electrolytic or electroless method.

A metallization produced by means of a deposition method, in particular, electrodeposition, is distinguished by high reproducibility, patternability and low roughness. The low roughness of the metal layer is of importance for a high conductivity at the surface.

The metal layer preferably comprises at least one layer containing metallic copper or a copper alloy. Alongside copper, e.g., the following materials can be used: Ni, Ag, Au, Al.

The same material as used for the conductor track can be used, in principle, for the topmost partial layer of the seed layer, in particular, copper. On account of a considerable height difference, a few micrometers in the case of the seed layer versus at least 10 micrometers in the case of the conductor track, the process can be conducted in such a way that the surface of the conductor track is attacked only to an insignificant extent during the etching of the seed layer.

In a further embodiment, the material of the respective partial layer of the seed layer differs from that of the conductor track and the first frame structure, in order to enable selective etching of the seed layer. In this case, the regions of the seed layer which are not covered by the conductor track can be removed without the material of the conductor track being attacked in the process. In one embodiment, the preferably copper-free partial layer of the seed layer that faces a copper-containing conductor track contains nickel. In a further embodiment, the preferably nickel-free partial layer of the seed layer that faces a nickel-containing conductor track contains copper.

As an alternative, e.g., before the photoresist layer used as an etching mask is actually removed, the surface of the conductor track can be gold-plated or coated by some other organic or inorganic material which enables selective etching of the seed layer.

The uncovered surface or the top side of the conductor track is preferably highly planar. It preferably holds true for at least 80% of the top side of the conductor track that no roughnesses above 100 nm occurs. The top side of the conductor track is planarized if appropriate taking account of supporting elements arranged on it.

The frame has at least one frame structure or a plurality of frame structures arranged one above another. At least the first (bottommost) frame structure arranged on the carrier substrate is preferably produced in the same method step and from the same material as the conductor track itself. At least one part of the conductor track and at least one frame structure can therefore comprise one and the same material.

The frame is preferably conductive. The frame is preferably higher than the total height of a layer construction comprising the seed layer and the conductor track arranged thereon. The height of the frame and of the supporting element is chosen depending on the desired bump height when flip-chip technology is used. The height difference between the conductor track and the supporting element is preferably at least 5 micrometers. The height difference can be obtained by thickening the first frame structure produced together with the conductor track, or by subsequently applying a second frame structure. The second frame structure and accordingly the supporting element can comprise a solderable layer preferably facing the chip.

In this case, the supporting element can be patterned together with the frame or with the conductor tracks during the same production steps.

In the edge region of the underside of the chip and where a connection to a supporting element is intended, it is possible to arrange a frame-type or areal or even just punctiform metal structure which is fixedly connected to the frame or the supporting element, e.g., by means of a soldering or welding connection.

The conductor track provided for forming the reactance element can be produced advantageously and cost-effectively in method steps which, such as, e.g., the production of the peripheral frame and the connection thereof to the chip, are provided for encapsulating the component structures of the chip.

The component can be produced in a method described below.

An adhesion layer is produced on the top side of the carrier substrate. A further, preferably conductive, layer, the seed layer, is produced on the adhesion layer. A photoresist layer is applied on the further layer and is patterned in order to form a mask by a direct exposure by means of a laser beam. As an alternative, other patterning methods such as mask exposure or screen printing methods can also be used. Openings are produced in the photoresist. In this case, regions of the seed layer are uncovered in accordance with the predefined geometry of the reactance element and, if appropriate, of the contact areas and/or of the frame and of the supporting element. Trenches or grooves for the frame, the supporting element and the structures of the reactance element are thus formed. The bottom of the respective blind hole depression and of the respective trench is formed by the seed layer. The walls of the blind hole depressions and the trench are formed by the inner walls of the openings formed in the photoresist layer.

Through the direct exposure by means of the laser beam, relatively high aspect ratios can be realized during the formation of the conductor tracks. An aspect ratio is understood to mean the ratio of the height to the width for the respective structure. In particular, it is possible to realize an aspect ratio of approximately 1:1 or 2:1 and beyond.

In the next method step, the blind hole depressions and the trench are filled. That is to say that in these regions a metal layer is produced on the seed layer. The metal layer is preferably grown or deposited. Electrodeposition or electroless deposition is appropriate, by way of example.

The blind holes are preferably filled only up to a specific height that is less than the height of the photoresist layer. The photoresist layer with the filled blind holes is preferably planarized by means of a mechanical method. In this case, not only is part of the photoresist layer removed, but the surface of the structures of the metal layer is also polished. A diamond milling method is particularly well suited for this purpose.

As a result of a low roughness of the surface, losses owing to the skin effect can be reduced.

After the photoresist layer has been removed, that region of the seed layer which was originally covered by the photoresist layer is etched away. If the surface of the conductor track is roughened by the etching process, it can be planarized again after the etching.

The structures of the metal layer which are provided as contact areas can have a smaller height than structures of the metal layer which are provided for forming the reactance element. The structures of the metal layer which are provided for forming the frame, the supporting element and the contact areas can be made higher than the structures of the reactance element. The height difference can be obtained by means of an additional lithography step. In this case, in the region of the contact areas or in the region of the conductor track provided for forming the coil, an additional photoresist layer is applied, which prevents further deposition of the material. The regions of the metal layer which are respectively not covered are augmented with regard to the height.

A solderable composition can be applied to the contact areas or alternatively to the connections of the chip. A solderable composition can also be applied to the frame, the supporting element or to a frame-type metal structure arranged in the edge region of the underside of the chip. As an alternative, it is also possible to use further technologies for mechanical or electrical connection such as stud bumps or Cu pillars.

The chip is arranged on the carrier substrate in such a way that it is supported by the frame and the supporting element. This arrangement is heated, the solderable composition melting. After cooling, the chip is fixedly connected to the contact areas of the substrate by means of bumps and to the frame and the supporting element by means of a soldering frame.

In one embodiment of the method, there is the possibility of realizing a "floating" coil by means of a multilayer process comprising at least two lithography steps. After the planarization of the surface of the layer formed by the first metal layer and the first photoresist layer, a further patterned photoresist layer is produced on some regions of the photoresist layer. In this case, new blind holes are formed, the bottom of which is formed partly by the surface of the lower photoresist layer and partly by the surface of the first metal layer. The blind holes are preferably filled with the same material as the first blind holes. In this case, a second metal layer arises, which, in one embodiment, has wider structures than the first metal layer. The structures of the second metal layer are supported partly on the structures of the first metal layer and are arranged partly on the first photoresist layer. In accordance with the later mechanical loads, these should be dimensioned during the patterning.

The surface of the layer formed by the second metal layer and the second photoresist layer is then preferably planarized. The photoresist layers are then removed. The seed layer is then etched away. In this case, the regions of the second metal layer which were originally arranged on the first photoresist layer remain as it were floating, that is to say spaced apart from the carrier substrate by an air gap.

The desired inductance value of the coil can be set by altering the geometry of the conductor track before the chip is emplaced. The conductor track can be thinned. As an alternative, the conductor track can be thickened. By way of example, an inkjet method for printing conductive structures is appropriate for this purpose. Electrolytic, electroless or laser-assisted deposition methods are also suitable.

The conductor track can be pinched by a mechanical pressure, or be deformed in a different way. The width of the conductor track can also be altered, in particular, reduced, which can be realized by means of a laser beam in one advantageous embodiment.

A suitable configuration of the conductor track makes it possible to reduce a temperature drift of the respective filter realized in the chip by virtue of the geometry of the coil being altered by the change in temperature. In this case, the coil is preferably employed in such a way that the respective edge of the passband of the filter which tends to drift downward as the temperature rises is shifted in the opposite direction by the temperature response of the coil.

The coil can also be tuned by the subsequent adaptation of the geometry.

By way of example, in the case of a ladder-type or lattice-type filter comprising series resonators arranged in series branches and parallel resonators arranged in shunt branches, it is possible to connect a coil in parallel with at least one of the series resonators. This shifts the antiresonance of the relevant resonator and thus also the right edge of the transfer function of the filter to higher frequencies. Heating of the component would then initially lead to the right filter edge being shifted to lower frequencies. At the same time, however, as a result of thermal expansion, the coil becomes geometrically larger and thus also acquires a larger inductance value. This tends to shift the right edge again somewhat further toward the right, or at least partly compensates for the temperature drift of the right edge of the passband.

For the antiresonance $\omega_0(L,T)$, the following holds true for the case where L is constant with respect to the temperature $$T: \frac{d\omega_0(L, T)}{dT} < 0.$$

If the coil has a temperature-dependent inductance $L(T)$, the following temperature dependence of the antiresonance arises:

$$\frac{d\omega_0(L, T)}{dT} = \frac{\partial \omega_0(L, T)}{\partial L} \frac{dL}{dT} + \frac{\partial \omega_0(L, T)}{\partial T}$$

In this case, the second summand is normally always negative in the case of SAW and BAW. For the exemplary circuit mentioned here, however, $$\frac{\partial \omega_0(L, T)}{\partial L}$$

is positive and $$\frac{\partial \omega_0(L, T)}{\partial L}$$

is likewise positive for coil substrates which expand as the temperature increases, since the inductance is proportional to the area enclosed by the coil. It is thus possible, in principle, for the resonator and the coil to be dimensioned in such a way that $$\frac{\partial \omega_0(L, T)}{\partial T} = 0$$

holds true. It is favorable to choose $$\frac{dL}{dT}$$

in particular to be relatively large. This can be done by using a substrate, or a layer between coil and substrate, for the coil with a large expansion coefficient. The coil can be also be embedded into the interlayer.

An analogous procedure is also possible when a parallel capacitance is used.

The carrier substrate has at least one dielectric layer composed, e.g., of ceramic or some other suitable material. Both an LTCC ceramic and an HTCC ceramic are appropriate here. LTCC stands for low temperature cofired ceramics. HTCC stands for high temperature cofired ceramics.

Contact areas provided for making electrical contact with the chip are arranged on the top side of the substrate. External connections of the component are arranged from the underside of the substrate. In one advantageous embodiment, the carrier substrate has a plurality of dielectric layers and metallization planes. The dielectric layers and the metallization planes are arranged one above another in an alternating order.

Plated-through holes are arranged in the carrier substrate, and serve for vertical electrical connection between different metallization planes. Primarily elements serving for wiring the chip to the external connections of the component, in particular, plated-through holes and conductor tracks running in the respective metallization plane, are arranged in the carrier substrate.

The metallization planes are patterned in order to form conductor track sections and conductive areas. With the aid of the conductor track sections and the conductive areas, it is possible to simulate various passive electrical components, in particular, transmission lines, capacitors and coils.

In principle, diverse function blocks, in particular, at least one low-pass filter, at least one high-pass filter, at least one transformer, at least one stripline, etc., can be realized in the carrier substrate by means of the passive components. There is the possibility of realizing at least one function block of the component partly within the carrier substrate and partly on the top side of the carrier substrate, preferably in the cavity.

The coil arranged in the cavity, on the top side of the carrier substrate, can form part of a multilayer coil that is partly realized by conductor tracks in the internal metallization planes of the carrier substrate.

At least one conductive area connected to ground can be arranged in the carrier substrate. This area is referred to as a ground plane. The ground plane, otherwise formed over a relatively large area, preferably has at least one cutout which is arranged in the region below the reactance element. In one embodiment, that region of the carrier substrate which is arranged below the reactance element is free of conductor tracks or metal areas which are wider than 130 micrometers, for example, preferably at least down to a depth of 200 micrometers. The depth is measured downward from the underside of the reactance element.

As an alternative, the ground plane can have a cutout in the form of at least one slot which in a projection plane preferably crosses the conductor track of the coil at least once. The slot is preferably at least as long as half the diameter of the region occupied by the coil.

As an alternative, the ground plane can be perforated in the region arranged below the coil. The holes or slots can form a periodic arrangement.

In one embodiment, the conductor track has a first conductive layer and a second conductive layer, which is arranged partly on the first conductive layer and which has a larger width than the first conductive layer. At least one region of the second conductive layer is preferably spaced apart from the carrier substrate by a gap, in which case it is embodied in floating fashion in one embodiment. The gap can be an air gap, in particular. As an alternative, the gap can be filled with a material that differs from that of the carrier substrate.

At least one part of the coil can be arranged in the carrier substrate. Alternatively, the coil realized on the top side of the carrier substrate is connected to a coil arranged in the carrier substrate.

In one embodiment, at least one conductive structure which realizes at least one section of a transmission line or at least one plate of a capacitor is arranged in the cavity, that is to say between the chip and the carrier substrate. In one embodiment, both at least one transmission line and at least one capacitor are realized in the cavity alongside the at least one coil.

The coil has a parasitic parallel capacitance and capacitive coupling to adjacent conductive structures of the component. An effective parallel resonant circuit having a resonance at correspondingly high frequencies is formed in this case. The inductance value and the spatial orientation of the coil are chosen in such a way that the resonant frequency of the parallel resonant circuit lies above the operating frequency of the component. The resonant frequency is higher than the operating frequency preferably by at least the factor 1.5. It is thus possible to obtain a particularly high quality factor of the coil at the operating frequency of the component.

A transformer can be realized by means of two inductances embodied in the manner explained above.

The turns of two coils which together form a transformer can run in opposite senses. However, the turns of two coils can also run in the same sense.

A capacitor can be realized by means of two electrically conductive areas arranged one above another. At least one of these areas is arranged in an internal plane of the carrier substrate. The other conductive area can also be arranged within the substrate. However, it can also be arranged on the surface of the carrier substrate. The second conductive area is preferably arranged in the closed cavity, below the chip.

As an alternative, the capacitor can be formed in one plane. In this case, the capacitor has two intermeshing comb-like electrodes.

BRIEF DESCRIPTION OF THE DRAWINGS

The component specified and its advantageous configurations are explained below with reference to schematic figures that are not true to scale. In the figures.

The following list of reference symbols may be used in conjunction with the drawings:
1 Carrier substrate
2 Chip
21 Acoustic component structures
22 Connections of the chip
3 Frame
31 Conductor track for forming the inductance
32 Contact area on the carrier substrate
33, 36, 38 Plated-through hole
34 Internal conductor track
35 Connections of the component on the underside of the carrier substrate
4 Bump
5 Seed layer
6, 62 Photoresist layer
61 Openings
7 First conductive layer
71 Second conductive layer
73 Further conductive layer
8 Cavity
81 Air gap
91, 93 Electrodes of a capacitor
92 Dielectric of the capacitor
95 Supporting element

DETAILED DESCRIPTION OF ILLUSTRATIVE EMBODIMENTS

Figure 1A:
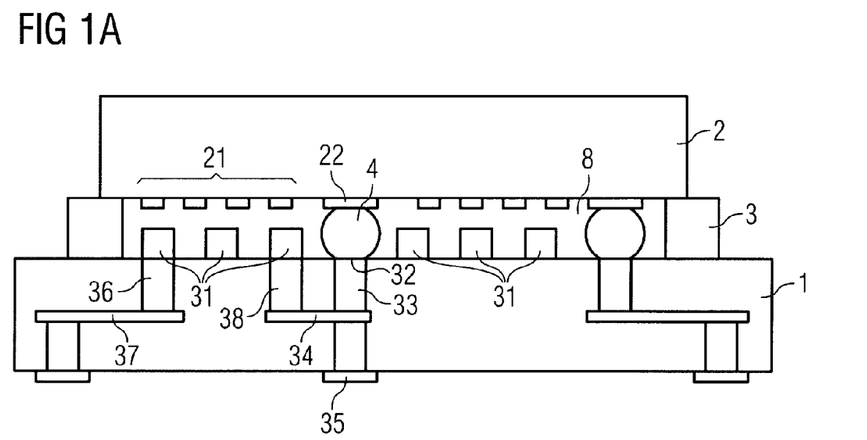
FIGS. 1A, 1B, 1C, 1D, 2, 3 in each case show a component with a carrier substrate, a chip and a reactance element on the top side of the carrier substrate.
Figure 2:
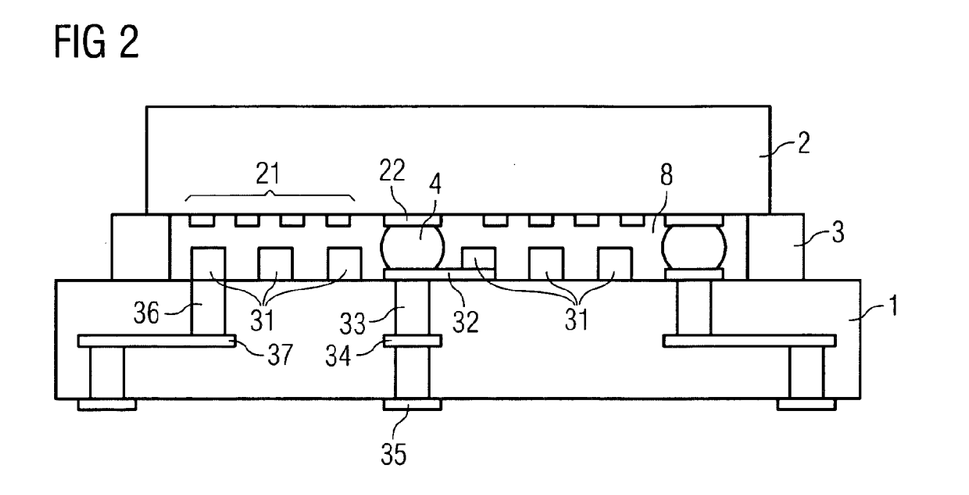
Figure 3:
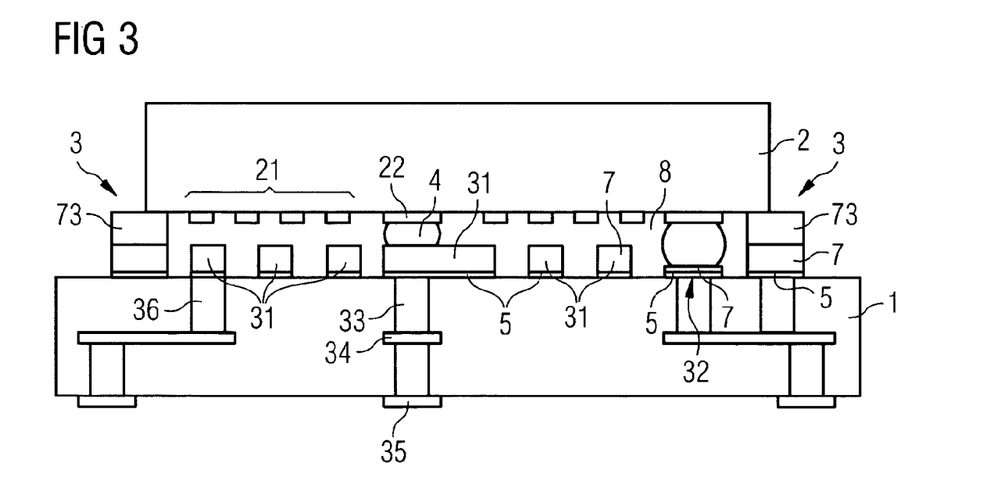

FIGS. 1A, 2 and 3 show in each case, a component with a carrier substrate 1 and a chip 2 mounted thereon by means of flip-chip technology. The peripheral edge region of the chip 2 is supported on the peripheral frame 3, which is arranged on the top side of the substrate.

The chip 2 has acoustically active component structures 21 comprising at least one SAW or BAW resonator. SAW stands for surface acoustic wave. BAW stands for bulk acoustic wave. Contact can be made with the component structures 21 via electrical contacts 22 of the chip. The component structures 21 and the contacts 22 are arranged on the underside of the chip 2.

The carrier substrate 1 has a plurality of dielectric layers, only two layers being shown in FIGS. 1A to 3. Each dielectric layer is arranged between two metallization planes.

Contact areas 32, at least one spiral conductor track 31 and the frame 3 are formed in the topmost metallization plane, which is arranged on the top side of the substrate 1. By means of the conductor track 31, a coil is realized as a "horizontal coil". The contact areas 32 can be formed by a discrete metallization (see FIG. 2) or else by the surface of a plated-through hole.

Figure 5A:
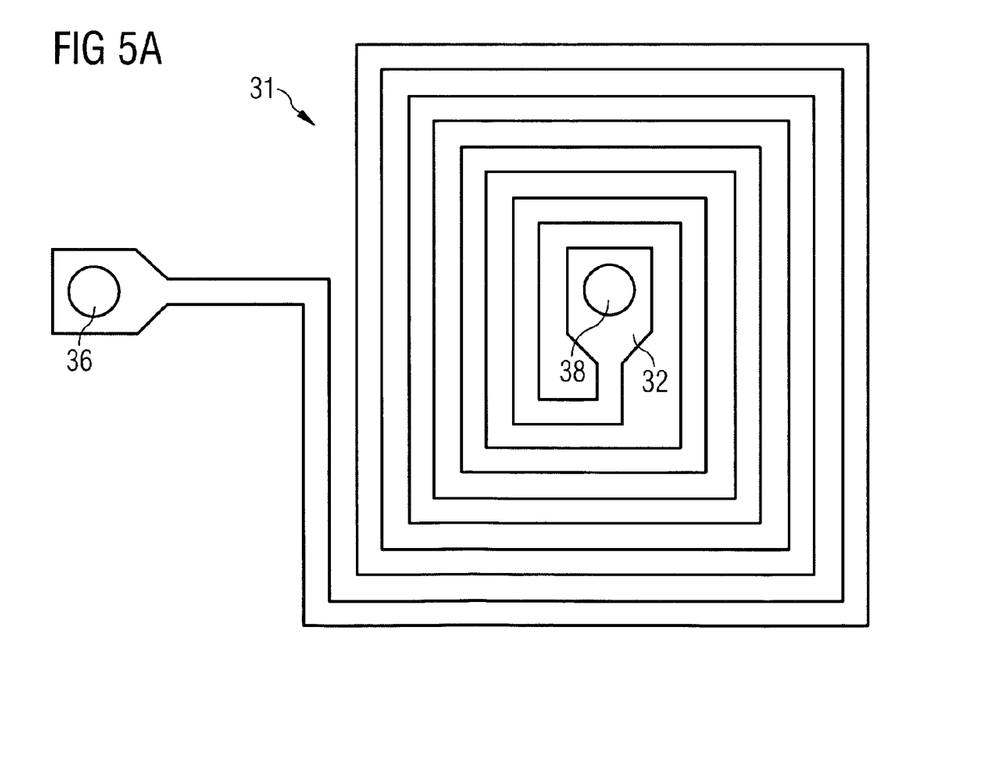
FIG. 5A shows a view of a reactance element embodied as a spiral conductor track.

The view of the coil from above is shown in FIG. 5A. In the bottommost metallization plane, external connections 35 of the component are formed as SMD contacts. SMD stands for surface mounted device (design). Conductor tracks 37 and a ground plane are arranged in the internal metallization plane. The ground plane is omitted below the coil. Conventional supporting elements (e.g. "pillars") cannot be arranged on the substrate area in the case of such an occupation density by structured conductor tracks, for space reasons. The arrangement of supporting elements according to the invention on the conductor tracks is correspondingly advantageous.

A closed cavity 8 is arranged between the carrier substrate 1, the chip 2 and the frame 3. The component structures 21, the electrical contacts 22 of the chip, the contact areas 32 and the conductor track 31 are arranged in the cavity and thereby protected against corrosion. In addition, the surface can be passivated by organic or inorganic protective layers. The height of the frame is selected such that a sufficiently wide gap of, e.g., at least 5 micrometers is ensured for the given height of the bumps 4, the conductor track 31 and the component structures 21 between the coil and the structures 21.

In the embodiment in accordance with FIG. 1A, contact is made with the coil via the plated-through holes 36 at one end and via the plated-through holes 38 at the other end. The coil is conductively connected to the contact area 32 via plated-through holes 38, the connection 34 and the plated-through hole 33. The contact area 32 is connected to the electrical contact 22 of the chip 2 via a bump 4.

Figure 1B:
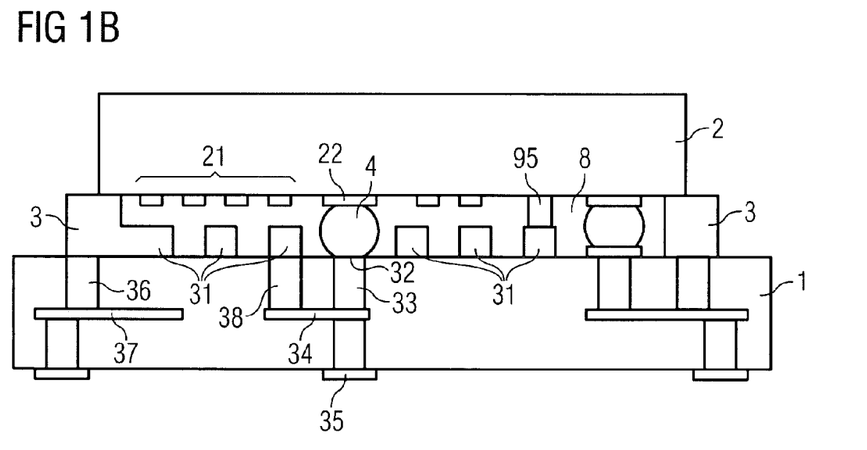

In the embodiment in accordance with FIG. 1B, the frame 3 is produced directly over at least one plated-through hole 36 and thus linked to a ground plane integrated in the substrate and/or a ground connection of the component. In this exemplary embodiment, the conductor track 31 is connected to the frame 3. A supporting element 95 is arranged between conductor track 31 and chip 2.

In the embodiment in accordance with FIG. 2, the contact area 32 and the in this case ground-side end of the coil are connected by means of a connecting conductor track formed on the top side of the carrier substrate 1. In one embodiment, this also applies to the other end of the coil in a corresponding manner. The surface of the connecting conductor track is preferably covered with a soldering resist or some other material suitable as a soldering resist.

There is the possibility of arranging a bump directly above the respective end of the coil, as in the embodiment in accordance with FIG. 3. In this case, too, the use of a soldering resist layer is expedient in order to delimit a region of the conductor track 31 that is provided as a contact area.

In FIG. 3, different bumps have heights that differ from one another owing to the height difference between the conductor track 31 and the contact areas 32.

A seed layer 5 is arranged on the top side of the substrate 1. The frame 3, the contact areas 32 and the conductor track 31 are formed on the seed layer 5.

The contact areas 32 and the conductor track 31 each comprise a conductive layer 7 arranged on the seed layer 5. The frame 3 has a first frame structure, which is arranged on the seed layer 5 and which is realized by means of the conductive layer 7, and a second frame structure, which is arranged thereon and which is realized by means of a further conductive layer 73.

Figure 5B:
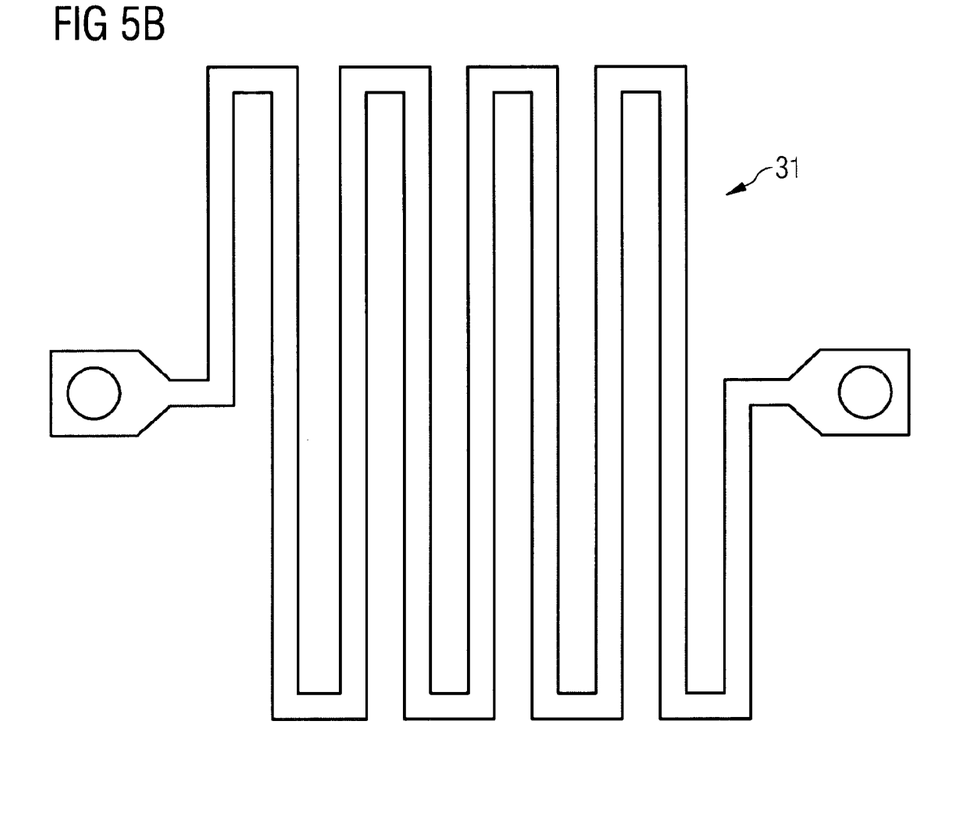
FIG. 5B shows a view of a conductor track embodied in meandering fashion.

The conductor track 31 used to realize the coil can be embodied in the form of a spiral, in accordance with FIG. 5A. The conductor track can also be embodied in the form of a meander, in accordance with FIG. 5B. Conductor tracks integrated in the carrier substrate can also be embodied as spirals or meanders.

Figure 1C:
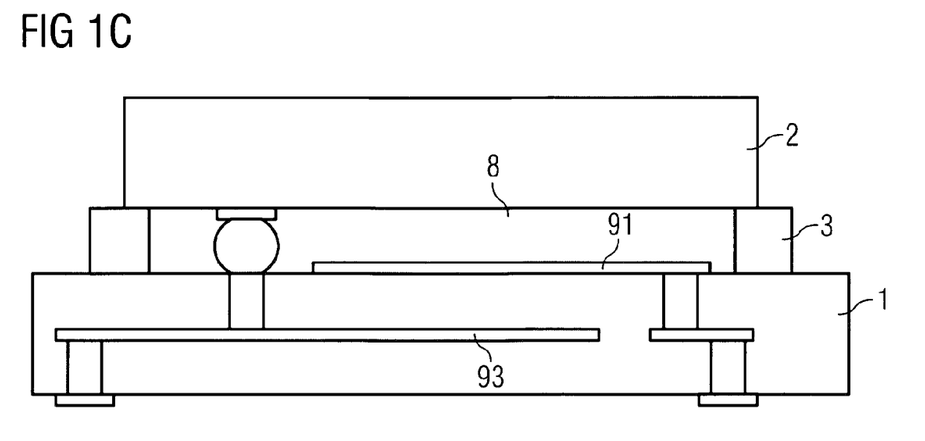
Figure 1D:
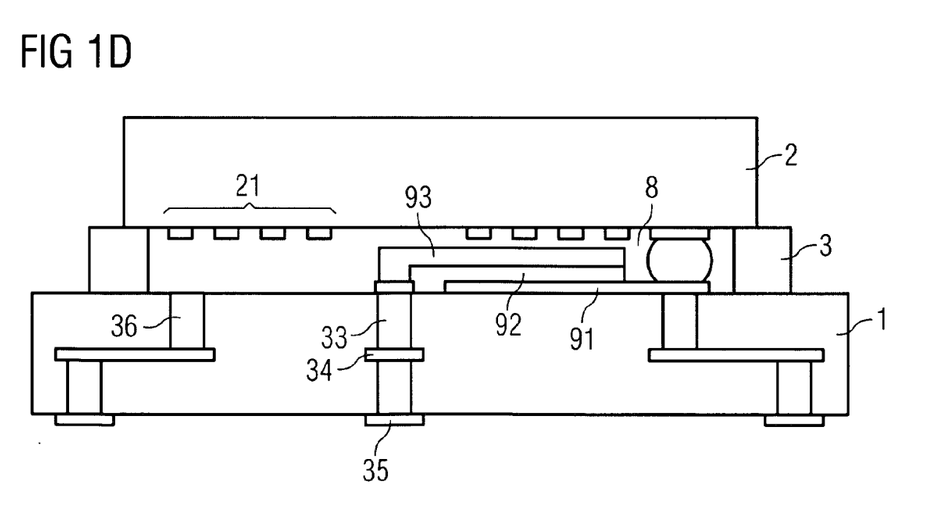
Figure 5C:
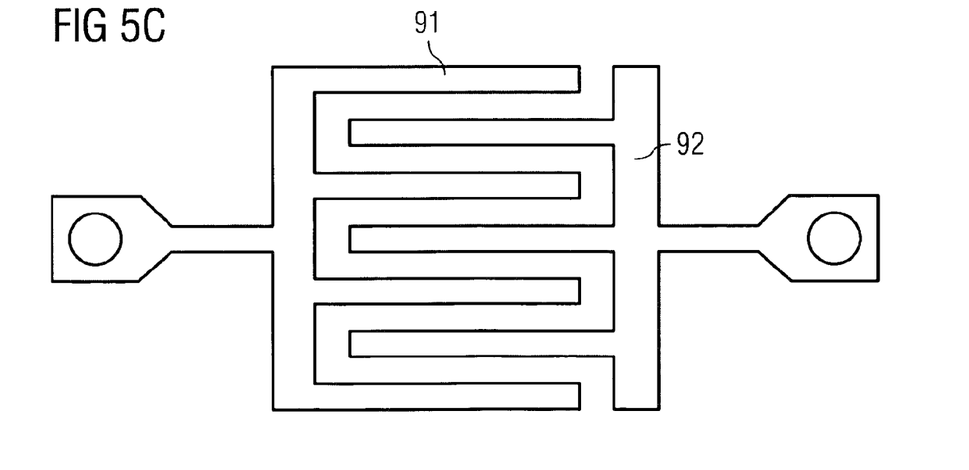
FIG. 5C shows a view of a capacitor formed in one plane with intermeshing comb-like electrodes.

Different embodiments for forming a capacitor are shown in FIGS. 1C, 1D and 5C.

In FIGS. 1C, 1D, the capacitor is realized by means of two electrically conductive areas 91, 93 arranged one above the other.

In the embodiment in accordance with FIG. 1C, the area 93 is arranged in an internal plane of the carrier substrate 1. The other conductive area 91 is arranged on the surface of the carrier substrate in this embodiment. It is situated in the closed cavity 8 below the chip 2. The dielectric of the capacitor is formed by the dielectric material of the carrier substrate 1 arranged between the areas 91, 93.

In the embodiment in accordance with FIG. 1D, the capacitor is realized on the surface of the carrier substrate 1, in the closed cavity 8. The conductive area 91 is arranged on the surface of the carrier substrate 1. A dielectric layer 92 is arranged on the conductive area 91. The conductive layer 93 is arranged on the dielectric layer 92.

In one advantageous embodiment, the dielectric layer 92 contains a polymer derived from BCB (benzocyclobutene) or some other suitable organic or inorganic material.

FIG. 5C shows a capacitor formed in one plane with intermeshing comb-like electrodes 91, 92. In one embodiment, this capacitor is arranged within the substrate. However, it can also be arranged on the surface of the carrier substrate. It is preferably arranged in the closed cavity, below the chip.

The method for producing the carrier substrate with an uncovered coil having a particularly smooth surface is explained in FIGS. 6A to 6F.

Figure 6A:
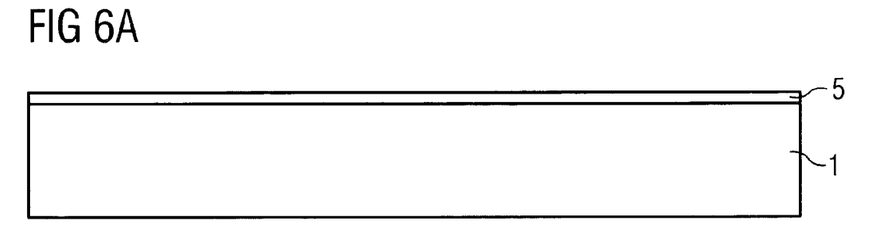
FIGS. 6A to 6F show various method steps for producing a coil on the top side of the carrier substrate.
Figure 6B:
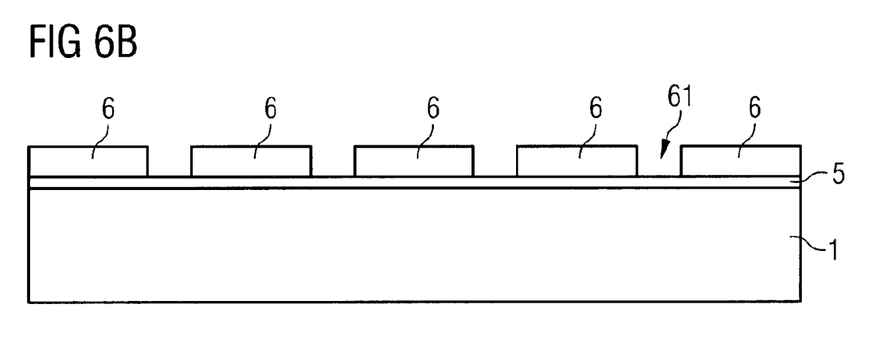

A seed layer 5 is produced on the carrier substrate 1 (FIG. 6A). A patterned photoresist layer 6 is produced on the seed layer 5. The photoresist layer has openings 61 in the regions provided for contact areas 32, the conductor track 31 and the frame 3 (FIG. 6B).

Figure 6C:
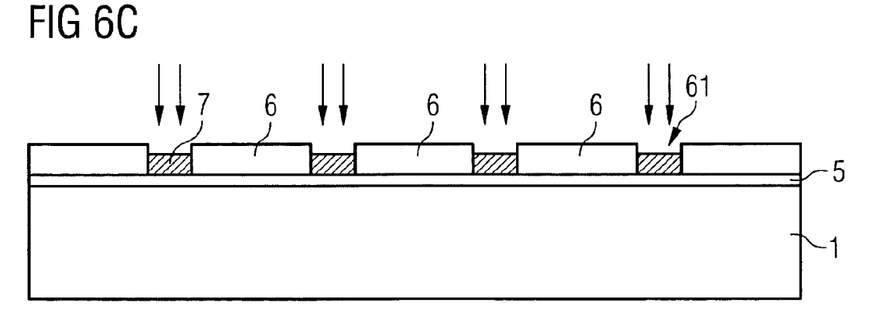
Figure 6D:
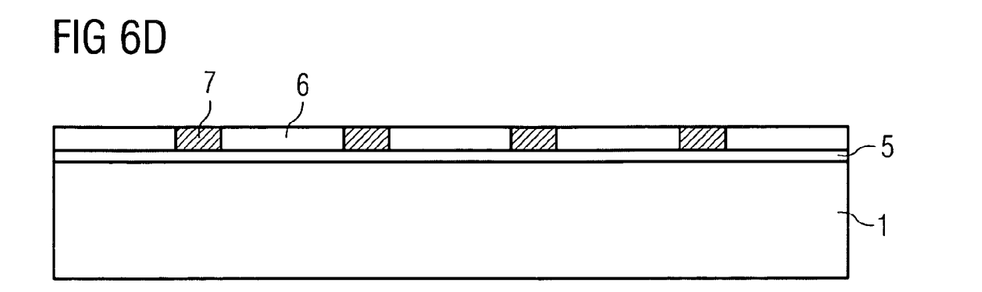
Figure 6E:
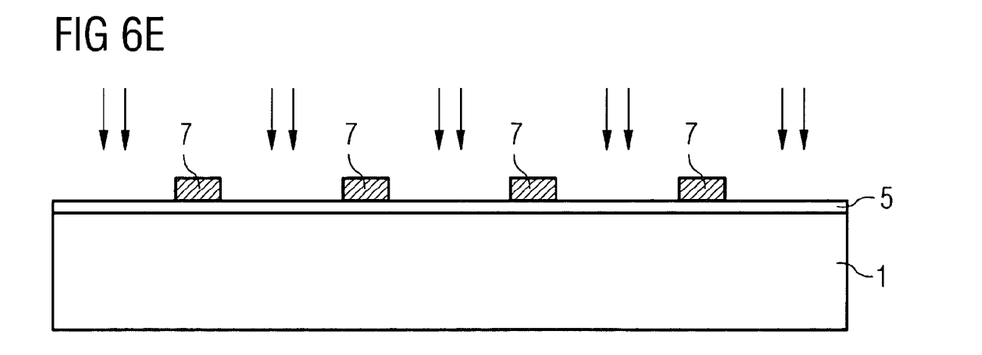
Figure 6F:
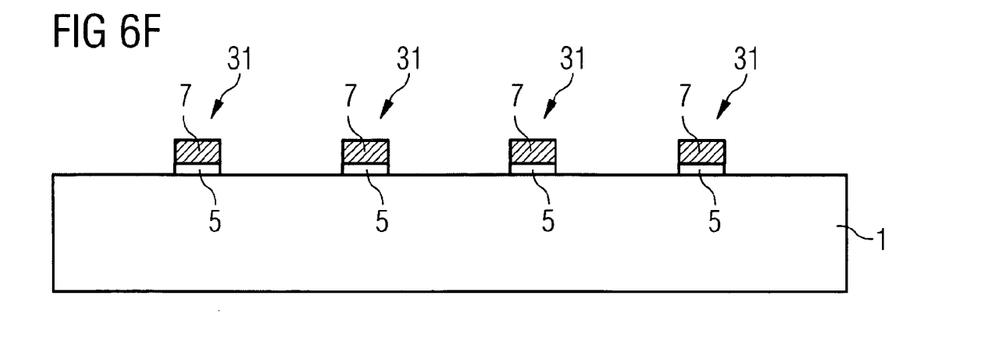

The openings 61 are at least partly filled with metal in order to form the first conductive layer 7. The metal is applied to uncovered regions of the seed layer 5 preferably by means of electrolytic or electroless deposition (FIG. 6C). The surface of the photoresist layer 6 with the filled openings 61 is planarized (FIG. 6D). The photoresist layer 6 is removed (FIG. 6E). The seed layer 5 is then etched (FIG. 6F).

Figure 4:
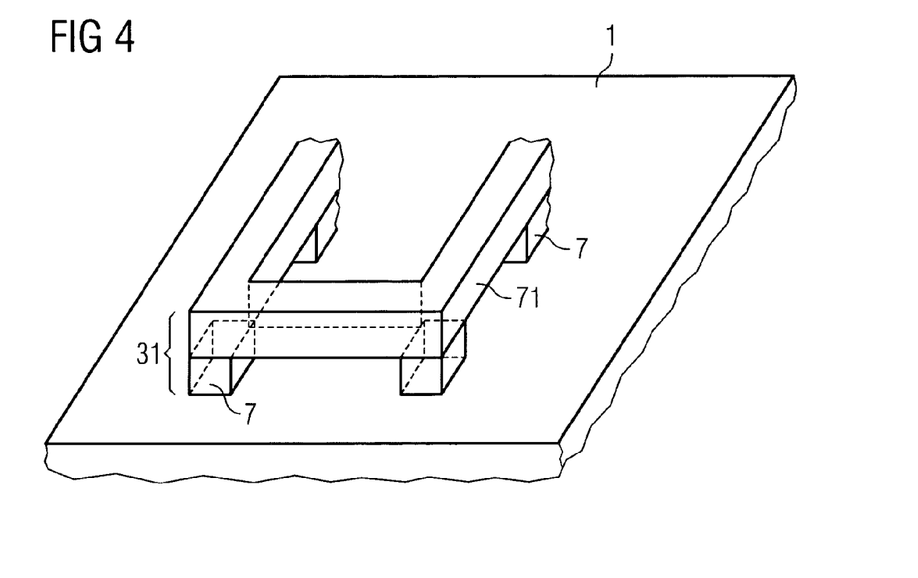
FIG. 4 shows a coil with bridge-like floating regions.

FIG. 4 shows a coil embodied as a "floating" coil. The conductor track 31 is formed by means of a first conductive layer 7 and a further conductive layer 71. Structures of the first conductive layer 7 are provided as spacers between the further conductive layer 71 and the substrate 1. They carry the structures of the further conductive layer 71 that float in bridge-like fashion, and constitute a preferred location for accommodating elements that support the chip. A flat air-core coil is simulated in this way.

The method for producing a floating coil is explained in FIGS. 7A to 7G. The method steps in accordance with FIGS. 7A to 7D correspond to the method already explained in connection with FIGS. 6A to 6D.

Figure 7A:
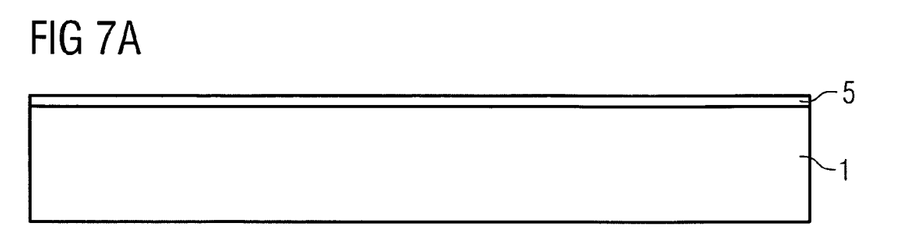
FIGS. 7A to 7G show various method steps for producing a floating inductance.
Figure 7B:
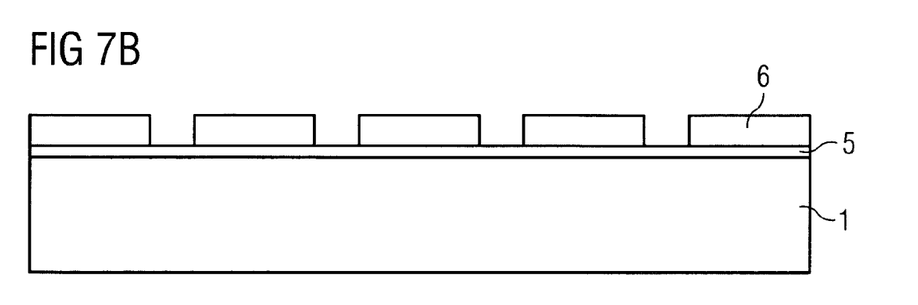
Figure 7C:
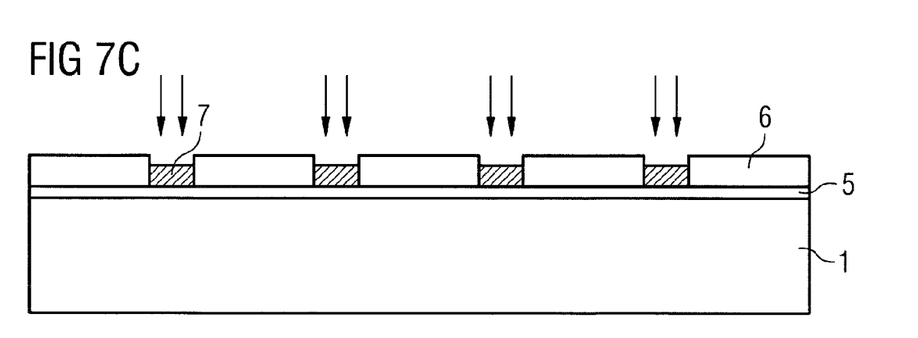
Figure 7D:
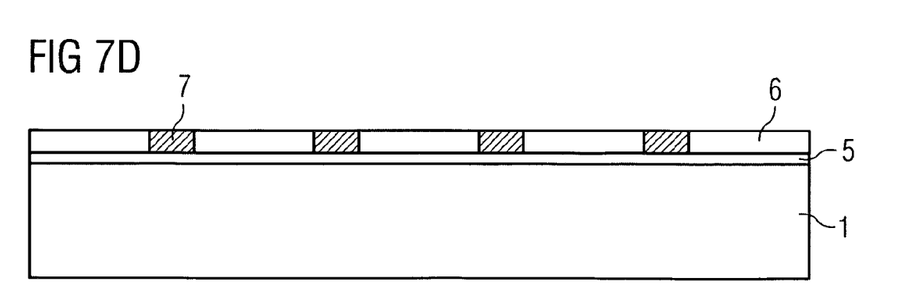
Figure 7E:
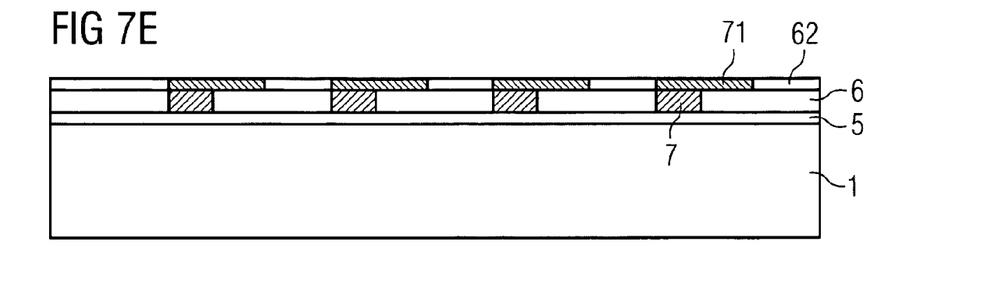

After the planarization, a second photoresist layer 62 with openings is produced on the first photoresist layer 6 with the structures of the conductive layer 7. The openings are filled with a conductive material in order to form the second conductive layer 71. Planarization is then carried out (see FIG. 7E). The method steps just described correspond, in principle, to FIGS. 6B to 6D.

Figure 7F:
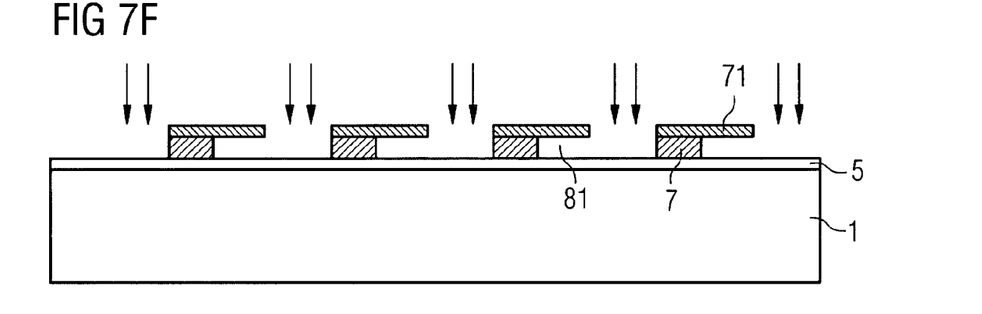

The part of the conductor track 31 which is realized by means of the second conductive layer 71 is wider or longer than the underlying structures of the first conductive layer 7. That region of the second conductive layer 71 which is initially supported by the photoresist layer 6 becomes floating after the removal of the photoresist layer (FIG. 7F).

Figure 7G:
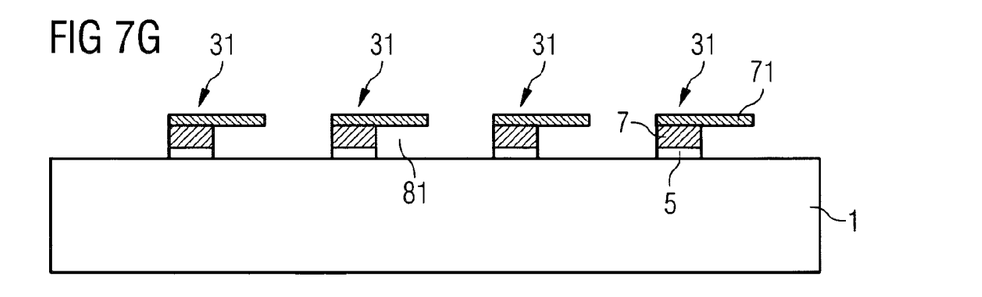

The seed layer 5 is then etched away (FIG. 7G).

Figure 8:
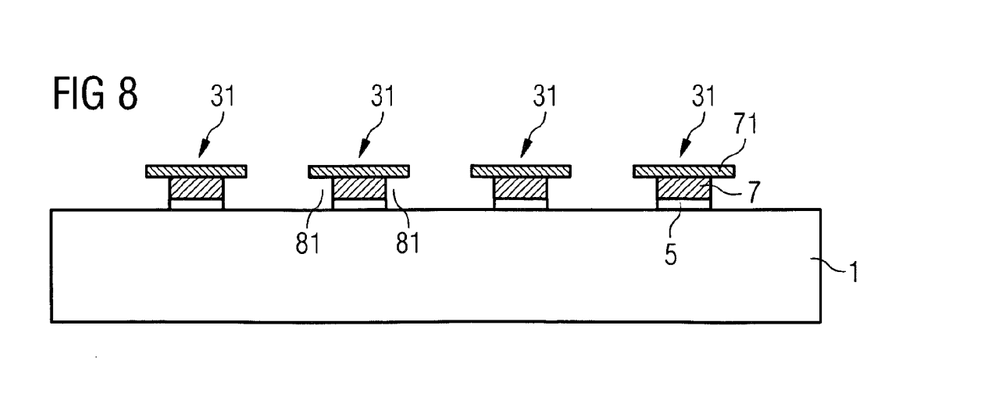
FIG. 8 shows a further example of the coil with floating regions.

The "air-core coil" shown in FIG. 7G has an L profile. The "air-core coil" in accordance with FIG. 8 has a T profile in cross section.

What is claimed is:

1. An electrical component comprising:
   a carrier substrate;
   a chip mounted on the carrier substrate, the chip having component structures operating with acoustic waves, the component structures being arranged on a side of the chip that faces the carrier substrate, wherein the component structures comprise an acoustic resonator, an electroacoustic transducer and/or an acoustic reflector;
   a supporting element between the chip and the carrier substrate;
   at least one reactance element arranged between the carrier substrate and the chip and at least partly realized by at least one conductor track, wherein the at least one reactance element comprises a coil, a capacitor and/or a transmission line; and
   a peripheral frame arranged between the chip and the carrier substrate at an edge region of the chip, wherein a closed cavity is formed between the peripheral frame, the chip and the carrier substrate, the component structures and the at least one conductor track of the at least one reactance element being arranged in the closed cavity.

2. The component as claimed in claim 1, wherein the supporting element is arranged between the at least one reactance element and the chip.

3. The component as claimed in claim 2, wherein the supporting element is embodied by a local thickening of the at least one reactance element.

4. The component as claimed in claim 2, wherein the supporting element is electrically conductively connected to the at least one reactance element and the chip and/or the carrier substrate.

5. The component as claimed in claim 2, wherein the supporting element is higher than the at least one conductor track of the coil.

6. The component as claimed in claim 1, further comprising:
   a peripheral frame arranged between the chip and the carrier substrate at an edge region of the chip,
   wherein a closed cavity is formed between the peripheral frame, the chip and the carrier substrate, the component structures and the at least one conductor track of the at least one reactance element being arranged in the closed cavity.

7. The component as claimed in claim 1, further comprising:
   a seed layer arranged on a top side of the carrier substrate,
   wherein the at least one conductor track of the at least one reactance element has at least one metal layer grown on the seed layer.

8. The component as claimed in claim 7,
   wherein the at least one conductor track comprises a first conductive layer and a second conductive layer arranged partly on the first conductive layer,
   wherein the second conductive layer has a larger width than the first conductive layer,
   wherein the seed layer is conductive,
   wherein the seed layer is deposited on a planarized carrier substrate,
   wherein the seed layer is patterned selectively with respect to material of the at least one reactance element.

9. The component as claimed in claim 8, wherein at least one region of the second conductive layer is spaced apart from the carrier substrate by an air gap.

10. The component as claimed in claim 1, wherein at least one part of the at least one conductor track and at least one part of the supporting element or peripheral frame comprise a same material having a same constitution.

11. The component as claimed in claim 1, wherein the at least one reactance element comprises the capacitor.

12. The component as claimed in claim 1, wherein the at least one reactance element comprises the coil, wherein the at least one conductor track has at least one section in a form of a meander.

13. The component as claimed in claim 1, wherein the at least one reactance element comprises the coil, wherein the at least one conductor track has at least one section in a form of a spiral.

14. The component as claimed in claim 1, wherein the at least one reactance element comprises the coil, wherein the at least one conductor track has at least one section in a form of a spiral.

15. An electrical component comprising:
    a carrier substrate;
    a chip mounted on the carrier substrate, the chip having component structures operating with acoustic waves, the component structures being arranged on a side of the chip that faces the carrier substrate, wherein the component structures comprise an acoustic resonator, an electroacoustic transducer and/or an acoustic reflector;
    a supporting element between the chip and the carrier substrate;
    a seed layer arranged on a top side of the carrier substrate; and
    at least one reactance element arranged between the carrier substrate and the chip and at least partly realized by at least one conductor track, wherein the at least one conductor track of the at least one reactance element has at least one metal layer grown on the seed layer;
    wherein the at least one reactance element comprises a coil, a capacitor and/or a transmission line;
    wherein the at least one conductor track comprises a first conductive layer and a second conductive layer arranged partly on the first conductive layer,
    wherein the second conductive layer has a larger width than the first conductive layer,
    wherein the seed layer is electrically conductive,
    wherein the seed layer is deposited on a planarized carrier substrate,
    wherein the seed layer is patterned selectively with respect to material of the at least one reactance element; and
    wherein at least one region of the second conductive layer is spaced apart from the carrier substrate by an air gap.

16. The component as claimed in claim 15, wherein the at least one conductor track of the at least one reactance element is embodied as a coil and has at least one section in a form of a spiral.

17. The component as claimed in claim 15, wherein, for the at least one conductor track of the at least one reactance element, the ratio of height to width is at least 1:2.

18. The component as claimed in claim 15, wherein the at least one conductor track of the at least one reactance element has a height of at least 5 micrometers.

19. The component as claimed in claim 15, wherein the seed layer comprises an adhesion layer containing Ti, TiW or Cu.

20. The component as claimed in claim 15, wherein the top side of the at least one conductor track is planarized.

21. The component as claimed in claim 20, further comprising an electrically-conductive, corrosion-resistant layer over the planarized top side.

22. The component as claimed in claim 20, further comprising a corrosion-resistant layer over the planarized top side.

23. The component as claimed in claim 20, wherein at least 80% of the top side of the at least one conductor track is plane or has a roughness of a height below 100 nm.

24. The component as claimed in claim 15, wherein structures of the first conductive layer are provided as spacers which support structures of the second conductive layer which float in a bridge-like fashion.

25. The component as claimed in claim 15, wherein the at least one reactance element comprises the coil, wherein the at least one conductor track has at least one section in a form of a spiral.

26. An electrical component comprising:
a carrier substrate;
a chip mounted on the carrier substrate, the chip having component structures operating with acoustic waves, the component structures being arranged on a side of the chip that faces the carrier substrate, wherein the component structures comprise an acoustic resonator, an electroacoustic transducer and/or an acoustic reflector;
a supporting element between the chip and the carrier substrate;
a coil arranged between the carrier substrate and the chip and at least partly realized by at least one conductor track, wherein the at least one conductor track has at least one section in the form of a meander or a spiral; and
a peripheral frame arranged between the chip and the carrier substrate at an edge region of the chip, wherein a closed cavity is formed between the peripheral frame, the chip and the carrier substrate, the component structures and the at least one conductor track of the coil being arranged in the closed cavity.

27. The component as claimed in claim 26, wherein the carrier substrate has LTCC or HTCC layers.

28. The component as claimed in claim 26, wherein the carrier substrate is constructed in multilayer fashion.

29. The component as claimed in claim 26, further comprising a conductive area connected to ground that is arranged in the carrier substrate, the conductive area having at least one cutout in a region arranged below the at least one conductor track of the coil.

30. The component as claimed in claim 29, wherein the conductive area has at least one slot which crosses the at least one conductor track at least once.

31. The component as claimed in claim 26, wherein the coil has a capacitive coupling to surrounding conductive structures of the component, such that a parallel resonant circuit is formed,
wherein an inductance value and a spatial orientation of the coil are chosen such that a resonant frequency of the parallel resonant circuit lies above an operating frequency of the component.

32. The component as claimed in claim 26, wherein the peripheral frame is conductively connected to a plated-through hole.

33. The component as claimed in claim 26, wherein temperature drift properties of the component are compensated for by opposing temperature drift properties of the coil.

34. The component as claimed in claim 26, wherein the peripheral frame is conductively connected to the coil.

* * * * *

UNITED STATES PATENT AND TRADEMARK OFFICE
CERTIFICATE OF CORRECTION

| | |
|---|---|
| PATENT NO. | : 8,558,356 B2 |
| APPLICATION NO. | : 12/606417 |
| DATED | : October 15, 2013 |
| INVENTOR(S) | : Juergen Kiwitt |

It is certified that error appears in the above-identified patent and that said Letters Patent is hereby corrected as shown below:

In the Claims

In Col. 15, line 14, claim 25, delete "claim 15" and insert --claim 1--.

Signed and Sealed this
Twentieth Day of May, 2014

Michelle K. Lee
*Deputy Director of the United States Patent and Trademark Office*